(12) United States Patent
Camarri et al.

(10) Patent No.: US 9,746,557 B2
(45) Date of Patent: Aug. 29, 2017

(54) PROXIMITY SENSOR MODULE INCLUDING TIME-OF-FLIGHT SENSOR WHEREIN A SECOND GROUP OF LIGHT SENSITIVE ELEMENTS IS IN A SECOND ONE OF THE CHAMBERS OF THE MODULE

(71) Applicant: Heptagon Micro Optics Pte. Ltd., Singapore (SG)

(72) Inventors: Camilla Camarri, Au (CH); Jonathan Hobbis, Kilchberg (CH); Bassam Hallal, Thalwil (CH)

(73) Assignee: Heptagon Micro Optics Pte. Ltd., Singapore (SG)

( * ) Notice: Subject to any disclaimer, the term of this patent is extended or adjusted under 35 U.S.C. 154(b) by 0 days.

(21) Appl. No.: 14/806,770

(22) Filed: Jul. 23, 2015

(65) Prior Publication Data

US 2016/0025855 A1 Jan. 28, 2016

Related U.S. Application Data

(60) Provisional application No. 62/054,486, filed on Sep. 24, 2014, provisional application No. 62/028,913, filed on Jul. 25, 2014.

(51) Int. Cl.
| | |
|---|---|
| G01S 17/02 | (2006.01) |
| G01S 17/08 | (2006.01) |
| G01S 7/481 | (2006.01) |
| G01S 7/497 | (2006.01) |
| H05K 1/02 | (2006.01) |
| H05K 1/18 | (2006.01) |

(52) U.S. Cl.
CPC .......... *G01S 17/026* (2013.01); *G01S 7/4813* (2013.01); *G01S 7/4816* (2013.01); *G01S 7/497* (2013.01); *G01S 17/08* (2013.01); *H05K 1/0274* (2013.01); *G01S 2007/4975* (2013.01); *H05K 1/181* (2013.01); *H05K 1/183* (2013.01); *H05K 2201/10106* (2013.01); *H05K 2201/10151* (2013.01); *H05K 2201/10545* (2013.01)

(58) Field of Classification Search
CPC . G01S 17/026; G01S 7/497; G01S 2007/4975
USPC ........................................ 250/551, 239, 221
See application file for complete search history.

(56) References Cited

U.S. PATENT DOCUMENTS

| | | | |
|---|---|---|---|
| 7,336,350 B2 | 2/2008 | Dorrance et al. | |
| 7,889,257 B2 | 2/2011 | Oggier et al. | |
| 8,223,215 B2 | 7/2012 | Oggier et al. | |
| 8,575,537 B2 * | 11/2013 | Yao ...................... | H03K 17/941 250/221 |
| 2013/0012276 A1 | 1/2013 | Coffy et al. | |

(Continued)

*Primary Examiner* — Que T Le
(74) *Attorney, Agent, or Firm* — Fish & Richardson P.C.

(57) ABSTRACT

The present disclosure describes proximity sensor modules that include a time-of-flight (TOF) sensor. The module can include a plurality of chambers corresponding, respectively, to a light emission channel and a light detection channel. The channels can be optically separated from one another such that light from a light emitter element in the light emission chamber does not impinge directly on light sensitive elements of the TOF sensor in the light detection chamber. To achieve a module with a relatively small footprint, some parts of the TOF sensor can be located within the light emission chamber.

21 Claims, 8 Drawing Sheets

(56) References Cited

U.S. PATENT DOCUMENTS

2013/0079068 A1     3/2013   Coffy et al.
2013/0099101 A1     4/2013   Campbell

* cited by examiner

PROXIMITY SENSOR MODULE INCLUDING TIME-OF-FLIGHT SENSOR WHEREIN A SECOND GROUP OF LIGHT SENSITIVE ELEMENTS IS IN A SECOND ONE OF THE CHAMBERS OF THE MODULE

CROSS-REFERENCE TO RELATED APPLICATIONS

This applications claims the benefit of priority of the following U.S. Provisional Patent Applications: Ser. No. 62/028,913 filed on Jul. 25, 2014 and Ser. No. 62/054,486 filed on Sep. 24, 2014. The disclosures of these prior applications are incorporated herein in their entirety.

TECHNICAL FIELD

The present disclosure relates to proximity sensor modules that include a time-of-flight (TOF) sensor.

BACKGROUND

Some handheld computing devices such as smart phones can provide a variety of different optical functions such as one-dimensional (1D) or three-dimensional (3D) gesture detection, 3D imaging, proximity detection, ambient light sensing, and/or front-facing two-dimensional (2D) camera imaging. Proximity sensor modules can be used, for example, to detect the distance to (i.e., proximity of) an object up to distances on the order of about one meter. Integrating a proximity sensor into a device such as a smart phone or other handheld device, however, can be challenging because space in the host device typically is at premium. Thus, there is a need to achieve accurate proximity sensor modules having a relatively small foot print.

SUMMARY

The present disclosure describes proximity sensor modules that include a time-of-flight (TOF) sensor.

The module can include a plurality of chambers corresponding, respectively, to a light emission channel and a light detection channel. The channels can be optically separated from one another such that light from a light emitter element in the light emission chamber does not impinge directly on light sensitive elements of the TOF sensor in the light detection chamber. However, to achieve a module with a relatively small footprint, some parts of the TOF sensor can be located within the light emission chamber.

For example, in one aspect, a proximity sensor module includes a light emitter element to generate light, at least some of which is directed out of the module. The module also includes a time-of-flight sensor including spatially distributed light sensitive elements and including circuitry to read and process signals from the light sensitive elements. The module has a plurality of chambers. The light emitter and a first group of the light sensitive elements are in a first one of the chambers; a second group of the light sensitive elements is in a second one of the chambers. The first and second chambers are optically separated from one another such that light from the light emitter does not impinge directly from the light emitter onto the second group of light sensitive elements in the second chamber.

In a particular implementation, some of the light sensitive elements are arranged to provide reference signals based on light from the light emitter element, and other ones of the light sensitive elements are arranged to provide detection signals in response to light entering the module (e.g., light reflected by an object external to the module). The first chamber includes the light emitter as well as the light sensitive elements arranged to provide the reference signals. The second chamber includes the light sensitive elements arranged to provide the detection signals. The chambers can be optically separated from one another by an interior wall such that light emitted by the light emitter does not impinge directly on the light sensitive elements arranged to provide the detection signals.

In some implementations, the interior wall includes a bridge portion extending over a surface of the time-of-flight sensor.

Other aspects, features and advantages will be readily apparent from the following detailed description, the accompanying drawings, and the claims.

DETAILED DESCRIPTION

Figure 1:
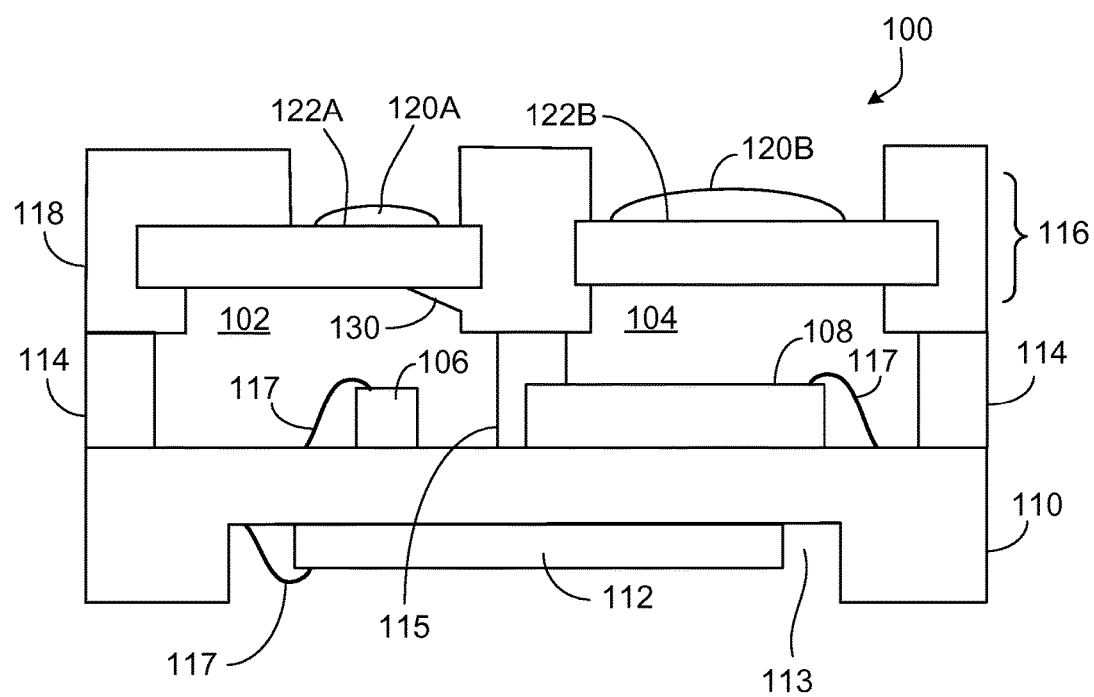
FIG. 1 illustrates a cross-sectional side view of a proximity sensor module.
Figure 3:
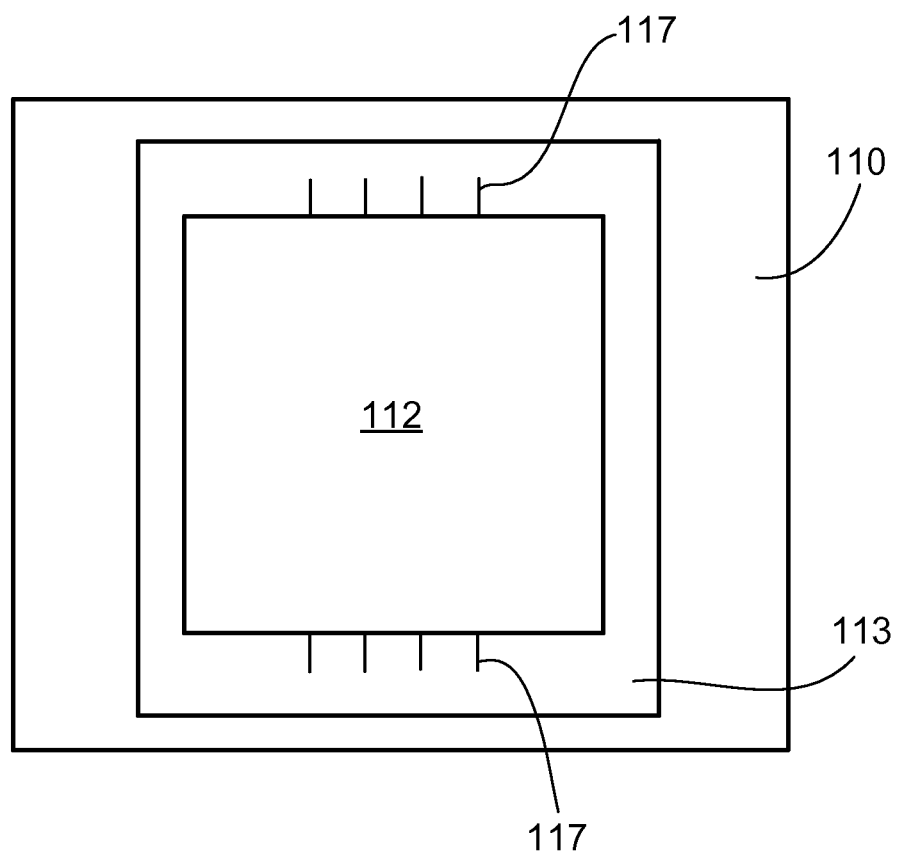
FIG. 3 is a bottom view showing an arrangement of components relative to the PCB.

FIG. 1 illustrates an example of an optoelectronic module 100 that includes a light emission channel 102 and a light detection channel 104. A light emitter 106 and a TOF sensor 108 are mounted on a first side of a printed circuit board (PCB) 110. The light emitter 106 can be operable to generate coherent, directional, spectrally defined light emission with minimal divergence relative to the emission axis (e.g., in the range of 10 to 20 degrees, and preferably no more than 15 degrees). Examples of the light emitter 106 are a laser diode or a vertical cavity surface emitting laser (VCSEL). An application-specific integrated circuit (ASIC) 112 can be mounted within a cavity 113 in the opposite (second) side of the PCB 110 (see also FIG. 3). This feature can maximize use of the available space and allow for relatively large footprints for the TOF sensor 108 and/or ASIC 112 for a given footprint for the PCB 110.

A spacer 114 is attached to the first side of the PCB 110 and separates the PCB 110 from an optics member 116, which can be embedded laterally, for example, in a non-transparent resin 118. The spacer 114 can be composed of a material (e.g., epoxy resin) and have a thickness such that it is substantially non-transparent to wavelengths of light detectable by the TOF sensor 108.

The optics member 116 includes a respective beam shaping element (e.g., a lens) 120A, 120B for each channel 102, 104. Each lens 120A, 120B can be formed, for example, on a respective transmissive cover 122A, 122B composed of glass or plastic. In some instances, the lenses 120A, 120B have maximum fields of view of 15 degrees, and preferably no more than 10 degrees. The transmissive covers 122A, 122B should be substantially transparent to a wavelength or light (e.g., infra-red radiation) emitted by the emitter 106. Light from the emitter 106 is directed out of the module and, if reflected by an object back toward the module's detection channel 104, can be sensed by the TOF 108.

The TOF sensor 108 includes an array of spatially distributed light sensitive elements (e.g., pixels), as well as electronics and logic to read and process the pixel signals. The emitter 106, the TOF sensor 108 and the ASIC 112 can be connected electrically to the PCB, for example, by conductive pads or wire bonds 117. The PCB 110, in turn, can be connected electrically to other components within a host device (e.g., a smart phone). The TOF sensor 108, together with the ASIC 112, is operable to resolve distance based on the known speed of light by measuring the time-of-flight of a light signal between the sensor and the subject for each point of an object. The circuitry in the TOF sensor 108 can use signals from the pixels to calculate, for example, the time the light has taken to travel from the emitter to an object of interest and back to the focal plane array. Compared to some other proximity sensors, the TOF sensor 108 can operate relatively quickly and provide relatively accurate proximity sensing.

Figure 2A:
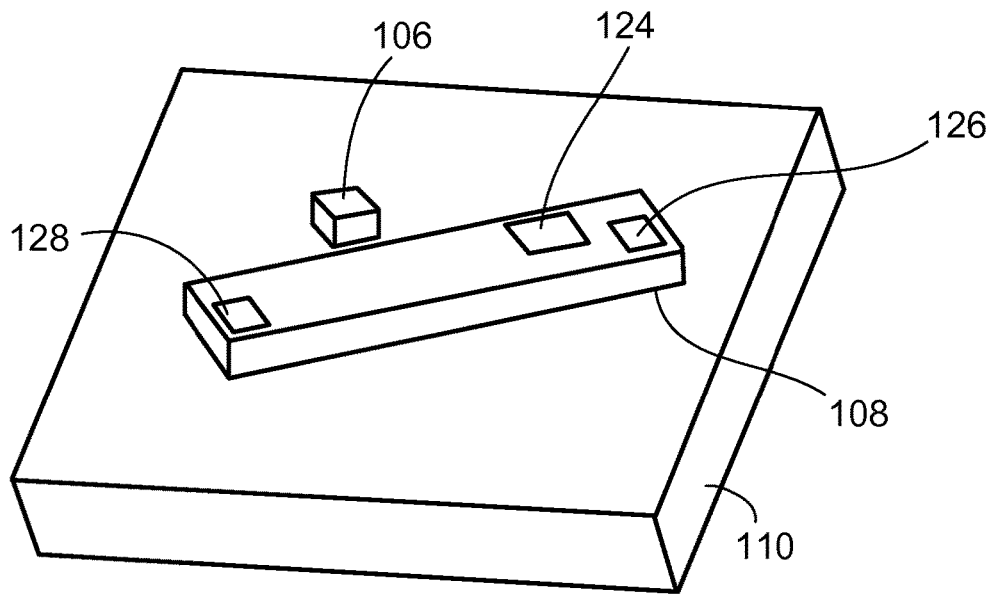
FIG. 2A is a perspective view of the time-of-flight (TOF) sensor on a printed circuit board (PCB).
Figure 2B:
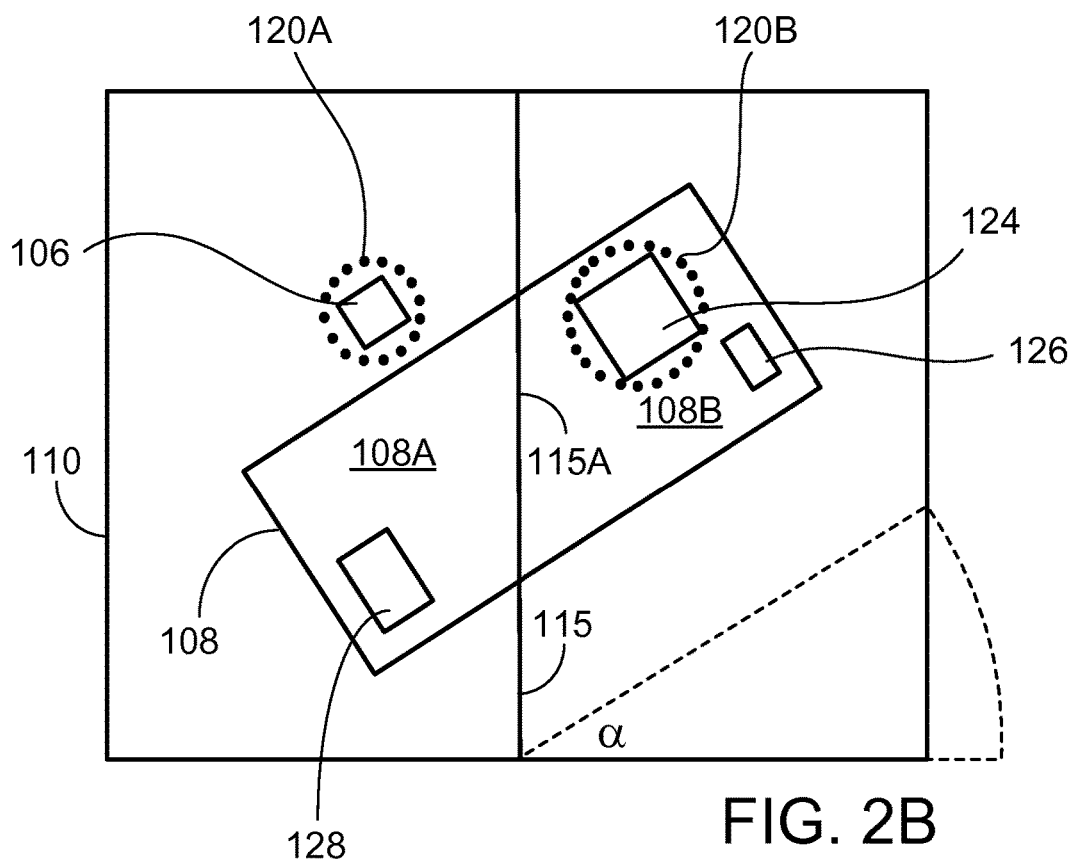
FIG. 2B is a top view showing an arrangement of components relative to the PCB.

The TOF sensor 108 can be implemented, for example, as an integrated sensor chip. As shown in FIGS. 2A and 2B, some implementations of the TOF sensor 108 include detection pixels 124, smudge pixels 126 and reference pixels 128. The detection pixels 124 provide the primary signals for determining the proximity of an object outside the module. As illustrated in FIG. 2B, the detection pixels 124 preferably are centered below the light detection channel lens 120B. The center optical emission axis of the emitter 106 preferably is aligned with the emitter channel lens 120A. Signals from the smudge pixels 126 can be used to correct for spurious reflections such as from a smudge (i.e., a blurred or smeared mark such as a fingerprint) on the transmissive cover of the host device. If such correction is not performed, the TOF sensor output may produce a spurious proximity signal, which can compromise the accuracy of the proximity data collected. Signals from the reference pixels 128 can be used to compensate for drift and to provide a zero distance measurement.

An interior wall 115 of the spacer 114 provides optical isolation between the module's two chambers (i.e., the light emission channel 102 and the light detection channel 104) such that light from the light emitter 106 does not directly impinge on the detection pixels 124. Further, a portion 115A of the interior wall 115 bridges across and rests on the surface of the TOF sensor 108 such that a first part 108A of the TOF sensor 108 is disposed within the first chamber 102 and a second part 108B of the TOF sensor 108 is disposed within the second chamber 104. In particular, as shown in FIG. 2B, the reference pixels 128 of the TOF sensor 108 can be located in the same chamber 102 as the emitter 106. On the other hand, the reference pixels 128 should be optically separated from the detection pixels 124. Thus, as shown in FIG. 2B, the detection pixels 124 can be located in the second chamber 104 (i.e., the detection channel). The smudge pixels 126 can be located in either chamber 102, 104. However, in some cases, it may be desirable to have the smudge pixels 126 located within the same chamber 104 as the detection pixels 124, which can help improve the accuracy of the TOF sensor's output.

Figure 5:
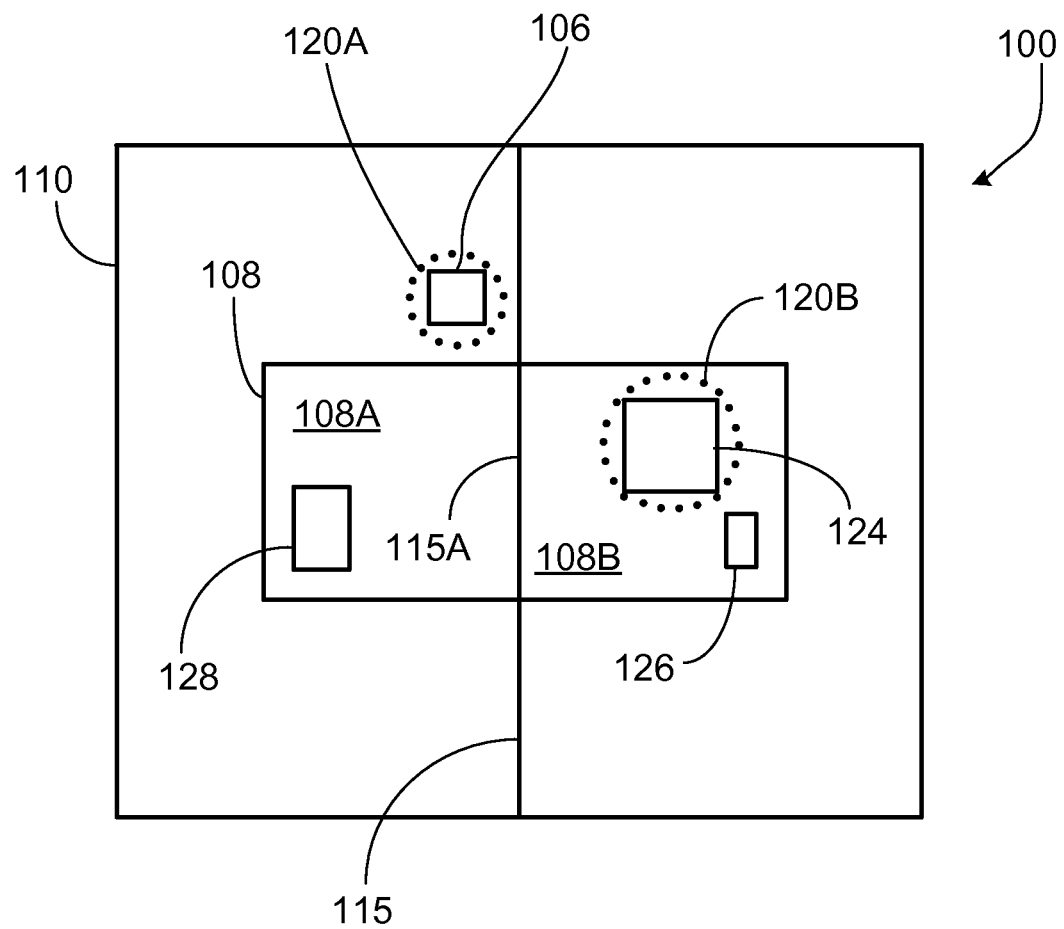
FIG. 5 is a top view showing another arrangement of components relative to the PCB.

To take advantage of the available footprint of the PCB 110, the TOF sensor 108, which may have a substantially rectangular footprint in some cases, can be disposed (relative to the long axis of the TOF sensor) at an angle ($\alpha$) with respect to the edge of the PCB 110. In some cases, the angle ($\alpha$) is in the range of 30-36 degrees, although the value of $\alpha$ may differ for other implementations. Further, in some cases, the side edges of the TOF sensor 108 are substantially parallel to the edges of the PCB 110 (see FIG. 5).

The interior wall 115 of the spacer 114 can include an integrally formed reflector 130 (see FIG. 1) to reflect a small amount of light emitted by the emitter 106 back toward the reference pixels 128 in the first chamber 102. The reflector 130 can be composed, for example, of a non-transparent epoxy resin. In some cases, a reflective coating (e.g., metallization) can be provided as the surface of the reflector 130.

Figure 4A:
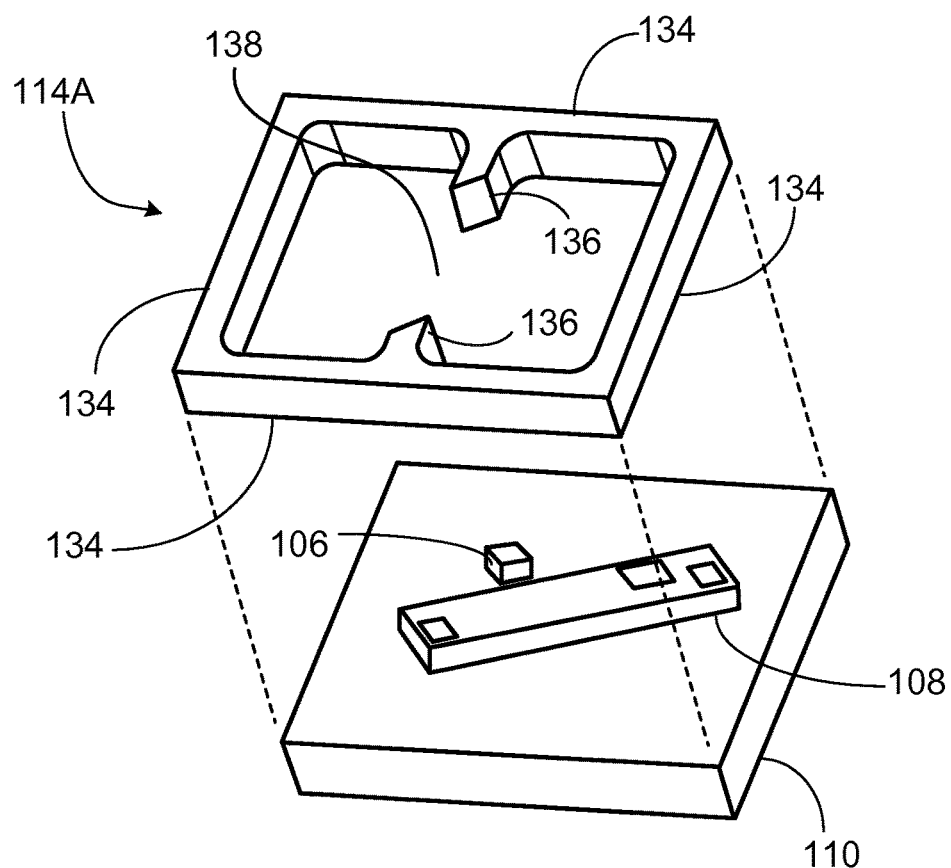
FIGS. 4A-4D illustrate a method of fabricating a proximity sensor module.
Figure 4B:
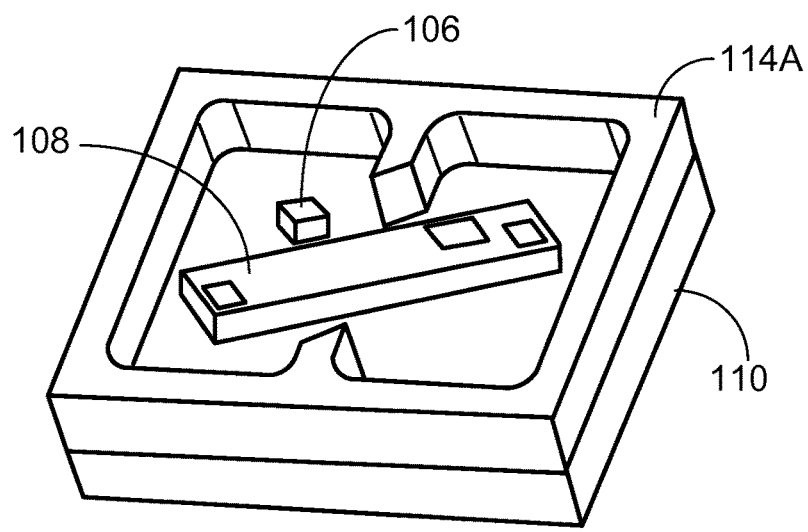
Figure 4C:
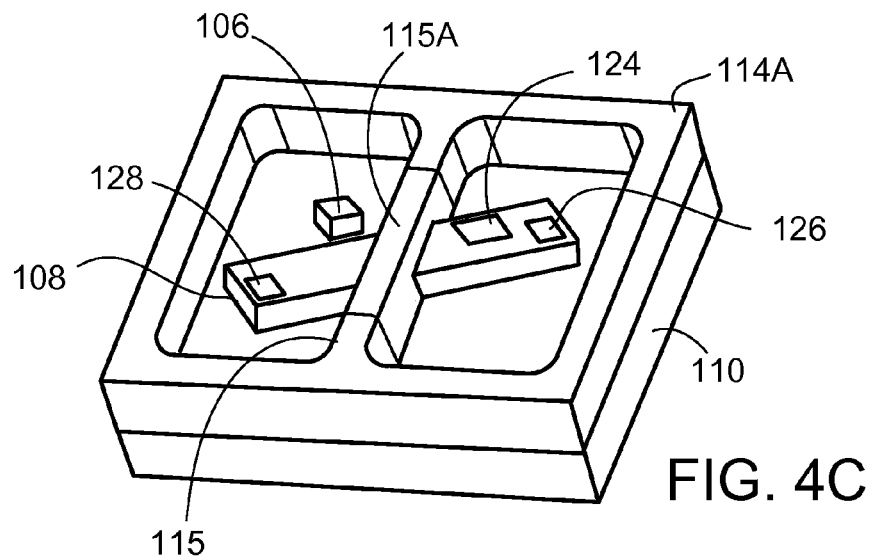
Figure 4D:
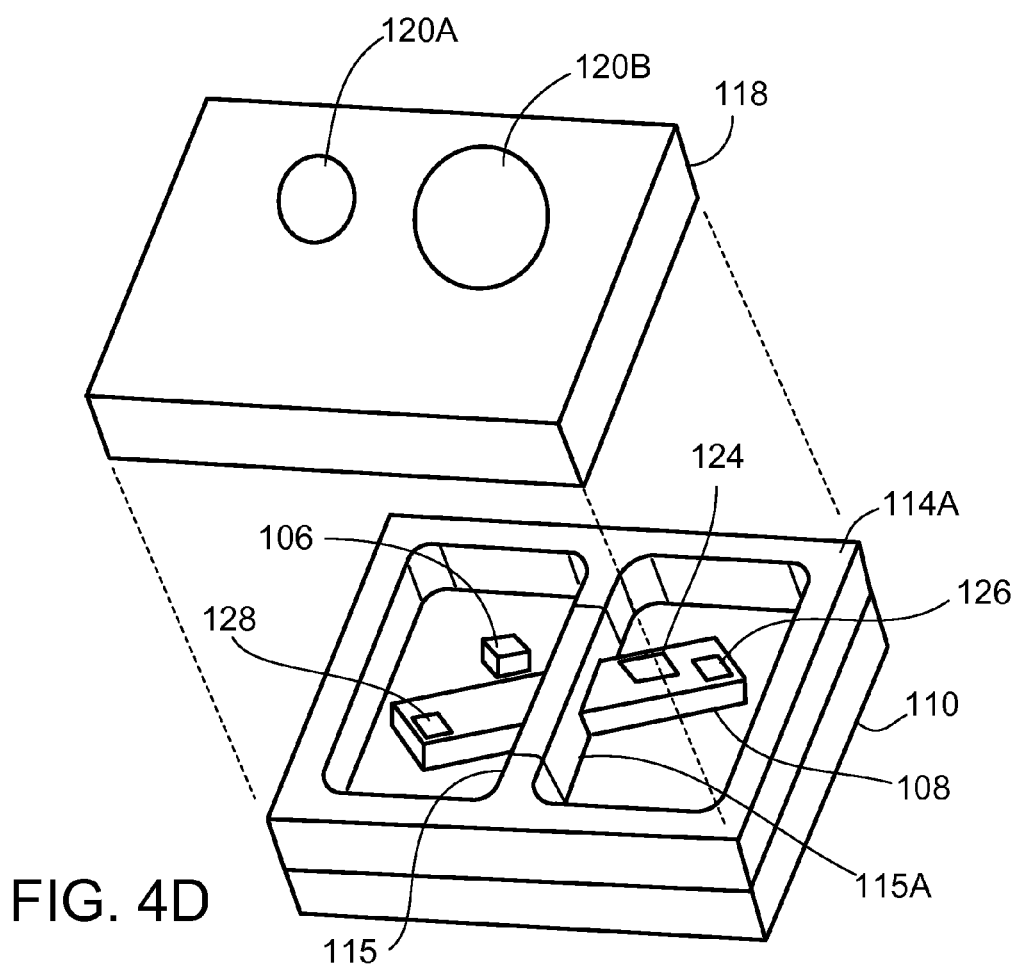

FIGS. 4A-4D illustrate a technique for fabricating the module 100. The emitter 106, TOF sensor 108 and ASIC 112 are mounted on the PCB 110. A spacer 114A, which can be composed, for example, of a non-transparent epoxy resin, includes outer walls 134 and partial interior wall extensions 136, with a gap 138 separating the partial interior wall extensions 136 from one another. The size of the gap 138 (i.e., the distance between the wall extensions 136) should be slightly larger than the corresponding dimension of the TOF sensor 108. As indicated by FIG. 4A and as shown in FIG. 4B, the spacer 114A can be attached directly to the surface of the PCB 110, for example, by an adhesive, such that the spacer 114A laterally surrounds the light emitter element 106 and the TOF sensor 108. After mounting the spacer 114A on the PCB 110, the gap 138 between the wall extensions 136 is filled so as to form the interior wall portion 115A such that the emitter and receiver chambers are separated optically form one another (see FIG. 4C). The interior wall portion 115A, which can be formed, for example, by dispensing a non-transparent epoxy material in the gap 138, bridges across the TOF sensor 108 and connects the two wall extensions 136. Next, as indicated by FIG. 4D, the encapsulated optics member 118 (including the lenses 120A, 120B) is attached to the spacer 114A and interior wall portion 115, 115A, for example, by an adhesive. In some implementations, the foregoing fabrication technique can be performed on a wafer-level to facilitate fabrication of multiple modules in parallel.

Figure 6:
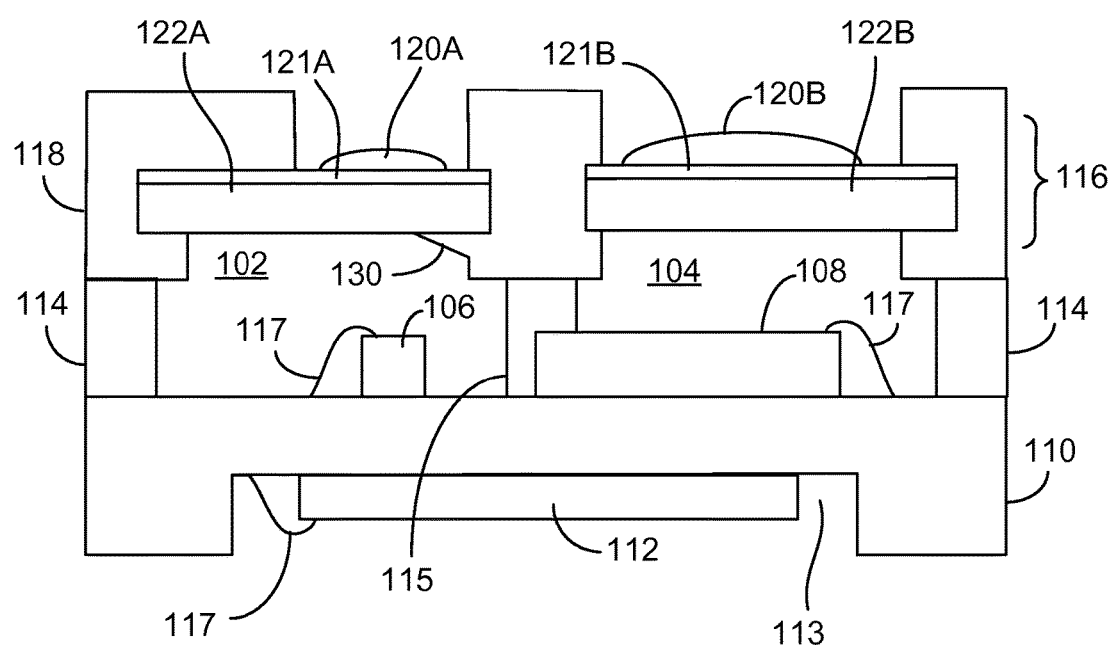
FIG. 6 illustrates a cross-sectional side view of another proximity sensor module.

In some implementations, it may be desirable to provide an optical filter in one or both of the optical channels 102, 104. For example, a filter coating, such as a dielectric filter, may be applied to one or both sides of lenses 120A, 120B and/or to one or both sides of transmissive cover 122A, 122B. FIG. 6 illustrates an example in which a respective filter coating 121A, 121B is provided on the object-side of each transmissive cover 122A, 122B. Each filter coating may be implemented, for example, as a band-pass filter that: 1) blocks ambient light (from outside of the module) from impinging on the detecting pixels 124 and/or the reference pixels 128, and 2) allows light emitted by the light emitter 106 to pass. In some cases, the filter coating 121A may reflect some of the light emitted by the light emitter 106. In such cases, it may be possible to omit the reflector 130. In general, the degree of reflectiveness and transmissiveness may depend strongly on the angle of incidence of the light emitted from light emitter 106. For example, in some instances, where the emission axis of the light emitter 106 is orthogonal to the plane defined by the transmissive cover 122A, 122B, or parallel to the optical axis of lenses 120A, 120B, the filter coating may be 10% reflective and 70% transmissive to light emitted at a 15-degrees divergence from the emission axis of the light emitter 106.

Figure 7:
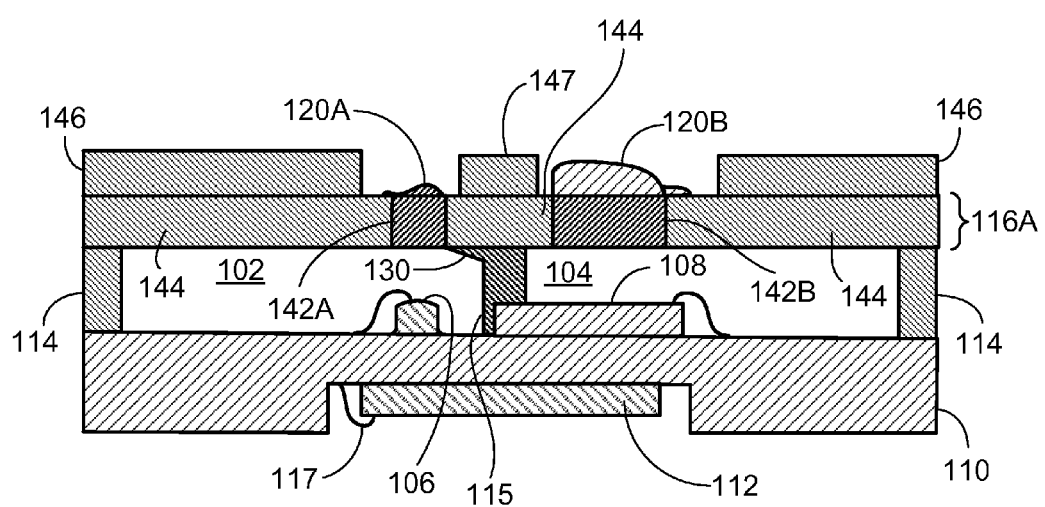
FIG. 7 illustrates another example of a proximity sensor module.

Other features that are included in some implementations are illustrated in FIG. 7. For example, in this case, the optics assembly 116A includes transmissive windows 142A, 142B formed in through-holes of a PCB or other non-transparent wafer 144. The through-holes can be filled, for example, with polymeric material to form the windows 142A, 142B. Thus, the windows 142A, 142B are embedded within the non-transparent PCB material. One or more respective beam shaping element such as lenses 120A, 120B can be formed on a surface of each transmissive window 124A, 124B. Further, a baffle 146, which also can be composed, for example, of a non-transparent PCB material, can be attached (e.g., by adhesive) to the optics member 116A. The baffle 146, which can laterally surround the lenses 120A, 120B, can help reduce the amount of stray light entering the module. Part 147 of the baffle 146 can serve a wall that separates the emitter lens 120A from the receiver lens 120B. As also illustrated by FIG. 7, the reflector 130 can be formed as a unitary piece that is contiguous with, and formed as the same material as, the spacer 114, 115.

The foregoing technique can result in small optical proximity sensor modules. In some implementations, the module 100 may have a footprint of less than 3 mm×3 mm. In some instances, the module may have a footprint of less than 2.5 mm×3 mm. Even with the addition of a baffle, the overall height of the module can, in some cases, be less than about 1.5 mm. Such small modules can be integrated advantageously into devices such as smart phones and other host devices in which space is at a premium.

As used in the present description, reference to a material or component being "transparent," "non-transparent" or "opaque" is made with reference to light at wavelength(s) emitted by the light emitter 106. Thus, in the context of the present disclosure, a material or component that is non-transparent or opaque may allow light of other wavelengths to pass through with little or no attenuation. Likewise, a material or component that is transparent to light emitted by the light emitter 106 may not allow light of other wavelengths to pass or may significantly attenuate light of such other wavelengths.

Other implementations are within the scope of the claims.

What is claimed is:

1. A proximity sensor module comprising:
 a light emitter element to generate light, at least some of which is directed out of the module; and
 a time-of-flight sensor including spatially distributed light sensitive elements and including circuitry to read and process signals from the light sensitive elements; and
 the module having a plurality of chambers, wherein the light emitter and a first group of the light sensitive elements are in a first one of the chambers, and wherein a second group of the light sensitive elements is in a second one of the chambers,
 wherein the first and second chambers are optically separated from one another such that light from the light emitter does not impinge directly from the light emitter onto the second group of light sensitive elements in the second chamber.

2. The proximity sensor module of claim 1 including an interior wall to separate the first and second chambers, wherein the interior wall has a bridge portion extending over a surface of the time-of-flight sensor.

3. The proximity sensor module of claim 1 wherein the second group of light sensitive elements includes detection pixels arranged to provide signals for determining a proximity of an object outside the module.

4. The proximity sensor module of claim 3 wherein the first group of light sensitive elements includes reference pixels arranged to provide signals for compensating for drift or to provide a zero distance measurement.

5. The proximity sensor module of claim 3 further including pixels arranged to provide signals to correct for a spurious reflection.

6. The proximity sensor module of claim 1 further including a respective optical filter coating over each of the first and second chambers.

7. A proximity sensor module comprising:
 a light emitter element to generate light, at least some of which is directed out of the module;
 a time-of-flight sensor including spatially distributed light sensitive elements and including circuitry to read and process signals from the light sensitive elements, wherein some of the light sensitive elements are arranged to provide reference signals based on light from the light emitter element, and wherein other ones of the light sensitive elements are arranged to provide detection signals in response to light entering the module;
 the module having a plurality of chambers, a first one of the chambers including the light emitter and including the light sensitive elements arranged to provide the reference signals, and a second one of the chambers including the light sensitive elements arranged to provide the detection signals,
 wherein the first and second chambers are optically separated from one another by an interior wall such that light from the light emitter does not impinge directly on the light sensitive elements arranged to provide the detection signals.

8. The proximity sensor module of claim 7 wherein the interior wall includes a bridge portion extending over a surface of the time-of-flight sensor.

9. The proximity sensor module of claim 7 wherein some of the light sensitive elements in the time-of-flight sensor further are arranged to provide signals for correction of optical cross-talk.

10. The proximity sensor module of claim 7 the light emitter element and the time-of-flight sensor are mounted on a first surface of a printed circuit board, and wherein an integrated circuit is mounted in a cavity on the opposite surface of the printed circuit board.

11. The proximity sensor module of claim 7 wherein the time-of-flight sensor is at an angle with respect to an edge of a printed circuit board on which the light emitter element is mounted.

12. The proximity sensor module of claim 7 further including a first beam shaping member arranged to direct light from the light emitter element out of the module, and a second beam shaping element arranged to direct light received from outside the module to the light sensitive elements that serve as the detection signals.

13. The proximity sensor module of claim 12 including a spacer separating a printed circuit board on which the light emitter element is mounted from an optics assembly including the first and second beam shaping elements.

14. The proximity sensor module of claim 7 further including a reflector to reflect some light from the light emitter element to the light sensitive elements that provide the reference signals.

15. The proximity sensor module of claim 14 wherein the reflector is formed as a unitary piece with a spacer that separates a printed circuit board on which the light emitter element is mounted from an optics assembly including the first and second beam shaping elements.

16. The proximity sensor module of claim 15 wherein the reflector is composed of a same material as the spacer.

17. The proximity sensor module of claim 16 wherein the reflector is composed of a material that is non-transparent to a wavelength of light emitted by the light emitter element.

18. The proximity sensor module of claim 12 further including a baffle laterally surrounding the first and second beam shaping elements.

19. The proximity sensor module of claim 7 wherein the spatially distributed light sensitive elements are pixels, wherein some of the pixels are dedicated to provide the reference signals based on light from the light emitter element, and wherein other ones of the pixels are dedicated to provide the detection signals in response to light entering the module.

20. A method of fabricating a proximity sensor module, the method comprising:

providing a printed circuit board having a surface on which are mounted a light emitter element and a flight-of-time sensor, wherein the time-of-flight sensor includes spatially distributed light sensitive elements and includes circuitry to read and process signals from the light sensitive elements, wherein some of the light sensitive elements are to provide reference signals based on light from the light emitter element, and wherein other ones of the light sensitive elements are to provide detection signals in response to light entering the module;

attaching a spacer to the surface of the printed circuit board such that the spacer laterally surrounds the light emitter element and the time-of-flight sensor, the spacer including first and second partial interior wall extensions separated from one another by the flight-of-time sensor;

forming a bridge extension over the time-of-flight sensor, the bridge extension connecting the first and second partial interior wall extensions to one another, wherein the light emitter element and the light sensitive elements to provide the reference signals are disposed to one side of the bridge extension, and wherein the light sensitive elements to provide the detection signals are disposed to another side of the bridge extension; and attaching an optics member over the spacer, wherein the optics member includes beam shaping elements arranged, respectively, to direct light from the light emitter element out of the module and to direct incoming light to the light sensitive elements arranged to provide the detection signals.

21. The method of claim 20 wherein forming the bridge extension includes dispensing a non-transparent epoxy material that connects the partial interior wall extensions.

* * * * *